Sept. 11, 1956

L. LAX 2,762,922

AUTOMATIC FREQUENCY CONTROL

Filed Feb. 15, 1954

Inventor
LADISLAV LAX
By Holcombe, Wetherill & Brisebois
Attorneys

United States Patent Office | 2,762,922
Patented Sept. 11, 1956

2,762,922

AUTOMATIC FREQUENCY CONTROL

Ladislav Lax, Cambridge, England, assignor to Pye Limited, Cambridge, England, a British company Application February 15, 1954, Serial No. 410,219

Claims priority, application Great Britain February 19, 1953

7 Claims. (Cl. 250—36)

The present invention relates to frequency discriminator arrangements such as are used for controlling the frequency of an oscillator. In order to keep an oscillator at a predetermined frequency, it is often necessary to compare the output frequency of the oscillator, or a derived frequency related to that output frequency, with a frequency standard. This frequency standard, may, for example, be a tuned circuit or a network of reactive elements, or may be an accurate standard oscillator. The output of the oscillator, or the related frequency, is then impressed on the standard circuit and the output response gives a measure of the frequency of the oscillator in relation to the standard frequency. One such comparison circuit consists of two resonant circuits respectively tuned slightly above and slightly below the oscillator output frequency, or the related frequency, and the difference in the voltages developed across the tuned circuit gives an indication of the oscillator frequency. Another such circuit consists of a circuit tuned to the desired output frequency of the oscillator, and when the oscillator frequency is applied thereto the phase of the response produced is a measure of the relationship of the oscillator frequency to the desired frequency. Frequency discriminators of the types aforementioned are described by D. E. Foster and S. W. Seeley in the Proceedings of the Institution of Radio Engineers, volume 25, page 289, and Hans Roder in volume 26, page 590 of the same journal. The output signal produced from one of the frequency comparison circuits above described can be utilised to adjust the oscillator towards its correct frequency.

However, the disadvantage of these previously described arrangements is that such circuits do not operate successfully when the output voltage from the oscillator is not sinusoidal, in which case the oscillator may lock on a sub-harmonic or harmonic of the desired frequency.

It is an object of the present invention to overcome this disadvantage and provide a frequency discriminator arrangement which can be used to control the frequency of a non-sinusoidal oscillator and which ensures the oscillator being locked at its correct frequency. In order to provide such an arrangement it is necessary to determine the fundamental frequency of the oscillator output.

From one aspect therefore, the present invention comprises an arrangement for controlling the frequency of an oscillator, particularly a non-sinusoidal oscillator, comprising two band-pass filters, the first of said filters covering a frequency band which is outside the fundamental frequency to which the oscillator is to be tuned, or a derived frequency related to such fundamental frequency of the oscillator, and the second of said filters covering a frequency band adjacent the frequency band of the first filter and which includes said fundamental frequency of the oscillator, or said derived frequency related thereto, wherein the output frequency from the oscillator, or said derived frequency related to said fundamental frequency, is applied to both band-pass filters, and a tuning device for adjusting the tuning of the oscillator is associated with the output from both band-pass filters, said tuning device being operated upon an output from the first of said filters for adjusting the tuning of the oscillator, so as to alter the oscillator tuning in one frequency direction toward the correct fundamental frequency and said tuning device being operated when there is no output from either filter to adjust the tuning of the oscillator in the other frequency direction, towards the correct fundamental frequency and said tuning device ceasing to operate upon an output being produced from said second band-pass filter.

Preferably, the frequency band covered by the first band-pass filter is below the fundamental frequency to which the oscillator is to be tuned, or the derived frequency related thereto, and the frequency band of the second band-pass filter which includes said fundamental frequency of the oscillator or said derived frequency, is arranged with its lower frequency limit just below the upper frequency limit of the first band-pass filter. If the frequency band of the second band-pass filter is made substantially narrow, the only sinusoidal output produced from this filter will be at the correct fundamental frequency of the oscillator, or at the derived frequency related thereto, and when an output is produced from this filter the oscillator will be tuned to substantially its correct frequency.

According to a feature of the invention, if the band-pass filters are arranged so that the upper frequency limit of the second filter is less than twice the upper frequency limit of the first filter, any output from the second filter will be purely sinusoidal and when such an output is produced it can be applied to a conventional discriminator, for example to a discriminator of the aforementioned known types and compared with a standard frequency to produce an output which can be used for finer tuning towards the correct fundamental frequency of the oscillator.

In order that the invention may be more fully understood, some embodiments thereof will now be described with reference to the accompanying drawings, in which.

Figure 1:
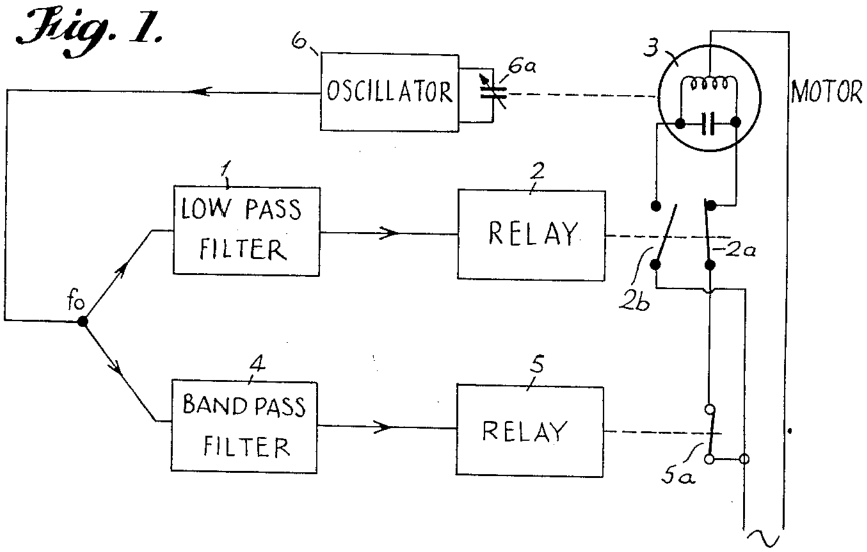
Fig. 1 is a circuit arrangement according to the invention.
Figure 2:
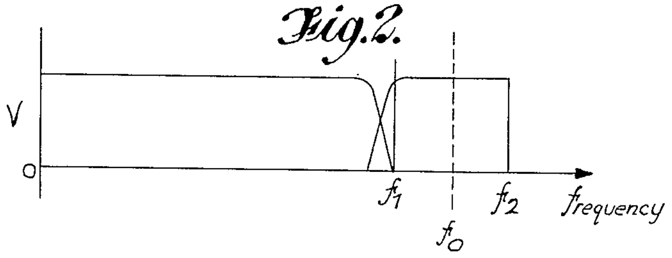
Fig. 2 is an explanatory diagram.

Referring to Figs. 1 and 2 of the drawings, the output from an oscillator 6 is fed to the low-pass filter 1, which is arranged to feed its output to operate the relay 2, the contacts 2*a*, 2*b* of this relay being connected in series with an A. C. power supply to a tuning motor 3, which can drive a variable condenser 6*a* to adjust the tuning of the oscillator 6. A band-pass filter 4, also connected to the output of oscillator 6, feeds its output to operate the relay 5; the contact 5*a* of this latter relay being connected in series with contact 2*a* of relay 2.

In Fig. 1 the contacts 2*a*, 2*b* and 5*a*, of the relays 2 and 5 respectively, are shown in the positions occupied when the relays are non-energised. Thus when relay 2 is energised, contacts 2*a* and 2*b* switch over to alter the connections of the A. C. supply to the motor 3, and thus change its direction of rotation, and when relay 5 is energised, contact 5*a* in series with contact 2*a* opens.

The frequency bands covered by the filters 1 and 4 are shown in Fig. 2, in which $f0$ represents the fundamental frequency to which the oscillator is to be tund. It can be seen that the low-pass filter covers a frequency band having an upper limit $f1$ which is below the fundamental frequency to which the oscillator should be tuned, and the band-pass filter 4, covers a frequency band from just below $f1$ to a frequency $f2$ which is above the fundamental frequency $f0$ to which the oscillator is to be tuned.

The operation of the device will now be explained. If the oscillator frequency falls within the frequency band covered by the low-pass filter 1, there will be an output from this filter which energises relay 2. The contacts 2*a*, 2*b* of this relay then change-over from the position shown in Fig. 1, thus connecting the A. C. supply through contact 2*b*, to drive the motor 3 in a direction to tune the condenser 6*a* so as to increase the frequency of the oscillator 6 towards the frequency *f*0. As the oscillator frequency passes *f*1, the output from the filter 1 will cease, relay 2 will be de-energised, and an output will be produced from the band-pass filter 4 which energises relay 5. The energisation of this latter relay causes its contact 5*a* to open and since relay 2 is now de-energised contact 2*b* is also open thus disconnecting the A. C. power supply from the motor 3 and stopping the tuning operation. If the oscillator frequency increases beyond the frequency *f*2, the output from the band-pass filter 4 becomes zero, relay 5 is de-energised and contact 5*a* closes again. Since relay 2 is also de-energised, contact 2*a* will be in the position shown in Fig. 1 and thus the A. C. supply will be connected to the motor 3 through this contact and the motor 3 rotates in the opposite direction to when it was supplied through contact 2*b*, and tunes the condenser 6*a* so as to decrease the frequency of the oscillator 6 towards the frequency *f*0.

It will thus be seen that if the frequency band covered by the band-pass filter is relatively narrow, the condenser 6*a* can adjust the oscillator 6 very close to its fundamental frequency.

Figure 3:
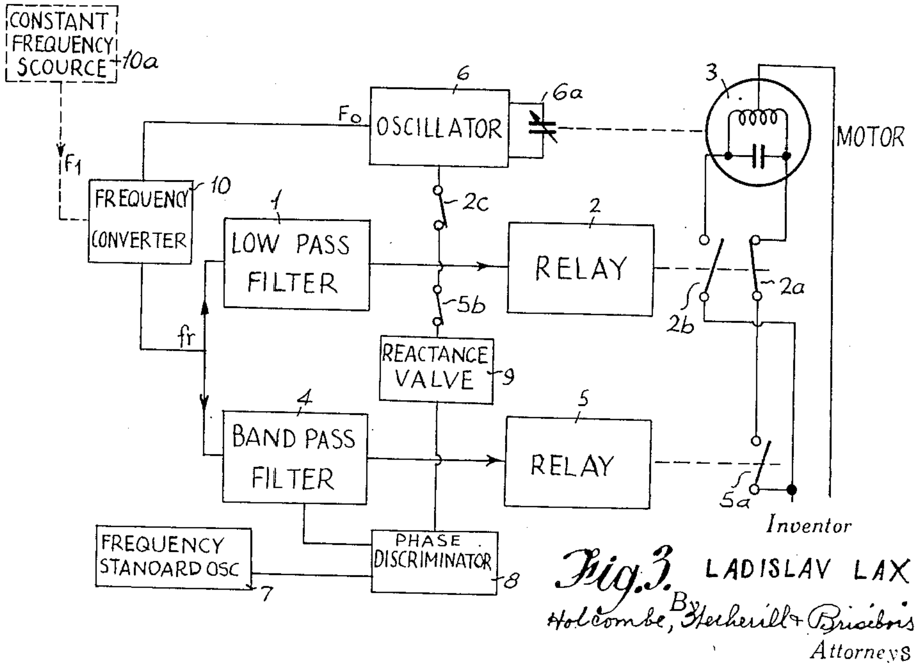
Fig. 3 is a modified circuit arrangement according to the invention.

A further embodiment of the invention is illustrated in Fig. 3. In this embodiment, the output F0 of the oscillator 6 is fed to the frequency converter 10 which produces an output frequency *fr* which is related to the fundamental frequency of the oscillator 6. This related frequency may be a multiple or sub-multiple of the output frequency and thus the frequency converter 10 may constitute either a multiplier or divider circuit. Alternatively the related frequency *fr* may be a beat frequency, or a multiple or sub-multiple of a beat frequency produced by beating the oscillator frequency F0 with a frequency F1 derived from a constant frequency source 10*a*, indicated in broken lines, in which case the frequency converter 10 constitutes a mixer circuit for producing the beat frequency. This related frequency *fr* is applied to filter circuits 1 and 4 controlling relays 2 and 5 respectively as in the embodiment of Fig. 1, to operate the tuning motor 3 adjusting the frequency of the oscillator 6.

In addition, in this form of the invention means are provided for fine tuning of the oscillator accurately to a standard frequency as shown in Fig. 3. In this embodiment the upper frequency limit *f*2 of the band-pass filter 4 is arranged to be less than twice the upper frequency limit *f*1 of the low-pass filter 1, so that the output produced by the filter 4 will be purely sinusoidal. In addition to feeding the relay 5, the output of the filter 4 is applied to a conventional phase discriminator circuit such as 8 where it is compared with the output from a frequency standard oscillator 7 tuned to the correct fundamental frequency of the oscillator 6 or the related frequency *fr*. The output from the discriminator 8 is then applied to a reactance valve 9 which can be switched through contacts 2*c* and 5*b* to the oscillator 6 to act as a fine tuning device to tune the oscillator accurately to the standard frequency. The operation of the circuit is similar to the embodiment illustrated in Fig. 1, but when the contact 5*a* of relay 5 opens upon an output being produced from the filter 4 and the tuning motor 3 stops, the additional contact 5*b*, which is associated with relay 5 closes to connect the reactance valve 9 to the oscillator 6 through the contact 2*c* which is closed when relay 2 is de-energised, to perform the fine tuning of the oscillator. The relay contacts in Fig. 3 are shown in the positions occupied when relay 5 is energised and relay 2 is de-energised.

I claim:

1. A circuit arrangement for controlling the frequency of an oscillator, comprising a first band-pass filter covering a frequency band which is outside the fundamental frequency to which the oscillator is to be tuned a second band-pass filter covering a frequency band adjacent the frequency band of said first filter and including said fundamental frequency of the oscillator means for applying the output of said oscillator to said first and second band-pass filters, a tuning device for adjusting the tuning of said oscillator associated with the output from said first and second band-pass filters means for controlling the operation of said tuning device in response to an output from the first of said filters for adjusting the tuning of said oscillator so as to alter the oscillator tuning in one frequency direction towards the correct fundamental frequency, means for stopping the operation of the tuning device in dependence upon the output from the second of said filters, and means for controlling the operation of the tuning device when there is no output from either said first or said second filter to adjust the tuning of the oscillator in the other frequency direction towards the correct fundamental frequency.

2. A circuit arrangement for controlling the frequency of a non-sinusoidal oscillator comprising means for deriving an output frequency from said oscillator, a first band-pass filter covering a frequency band which is outside the output frequency from said oscillator, a second band-pass filter covering a substantially narrow frequency band adjacent the frequency band of said first filter and so that said output frequency of the oscillator is the only sinusoidal output produced by said second filter means for applying said output frequency to said first and second band-pass filters, a tuning device for adjusting the tuning of said oscillator, associated with the output from said first and second band-pass filters, means for controlling the operation of said tuning device in response to an output from the first of said filters for adjusting the tuning of said oscillator so as to alter the oscillator tuning in one frequency direction towards the correct fundamental frequency, means for stopping the operation of the tuning device in dependence upon the output from the second of said filters, and means for controlling the operation of the tuning device when there is no output from either said first or said second filter to adjust the tuning of the oscillator in the other frequency direction towards the correct frequency.

3. A circuit arrangement for controlling the frequency of an oscillator, comprising means for deriving an output frequency from said oscillator, a first band-pass filter covering a frequency band which is outside the output frequency from said oscillator a second band-pass filter covering a frequency band adjacent the frequency band of said first filter and including said output frequency from said oscillator, means for applying said output frequency to said first and second band-pass filters, a tuning device for adjusting the tuning of said oscillator, associated with the output from said first and second band-pass filters, means for controlling the operation of said tuning device in response to an output from the first of said filters for adjusting the tuning of said oscillator so as to alter the oscillator tuning in one frequency direction towards the correct fundamental frequency, means for stopping the operation of the tuning device in dependence upon the output from the second of said filters, and means for controlling the operation of the tuning device when there is no output from either said first or said second filter to adjust the tuning of the oscillator in the other frequency direction towards the correct fundamental frequency, a discriminator circuit fed from the second of said filters, a frequency standard generator tuned to the output frequency derived from said oscillator and connected to said discriminating circuit, a reactance device fed from said discriminator circuit and means for connecting the output of said reactance device to said oscillator when the tuning device stops operating.

4. A circuit arrangement for controlling the frequency of a non-sinusoidal oscillator, comprising means for deriving an output frequency from said oscillator, a first band-pass filter covering a frequency band which is outside the output frequency from said oscillator, a second band-pass filter covering a frequency band adjacent the frequency band of said first filter and including said output frequency from said oscillator, means for applying said output frequency to said first and second band-pass filters, a tuning device for adjusting the tuning of said oscillator, associated with the output from said first and second band-pass filters, means for controlling the operation of said tuning device in response to an output from the first of said filters for adjusting the tuning of said oscillator so as to alter the oscillator tuning in one frequency direction towards the correct fundamental frequency, means for stopping the operation of the tuning device in dependence upon the output from the second of said filters, and means for controlling the operation of the tuning device when there is no output from either said first or said second filter to adjust the tuning of the oscillator in the other frequency direction towards the correct frequency and fine tuning means connected to said oscillator when the tuning device stops operating.

5. A circuit arrangement for controlling the frequency of an oscillator, comprising means for deriving an output frequency from said oscillator a first band-pass filter covering a frequency band which is outside the output frequency from said oscillator, a second band-pass filter covering a frequency band adjacent the frequency band of said first filter and including said output frequency from said oscillator, means for applying said output frequency to said first and second band-pass filters, a first relay operated by an output from said first band-pass filter, a second relay operated by an output from said second band-pass filter, a tuning motor for tuning said oscillator a power supply for said tuning motor, and means connecting the contacts of said relays to control the power supplies to said tuning motor in response to said outputs from said first and second band-pass filters.

6. A circuit arrangement for controlling the frequency of an oscillator, comprising means for deriving an output frequency from said oscillator, a first band-pass filter covering a frequency band which is outside the output frequency from said oscillator, a second band-pass filter covering a frequency band adjacent the frequency band of said first filter and including said output frequency from said oscillator means for applying said output frequency to said first and second band-pass filters, a first relay operated by an output from said first band-pass filter, a second relay operated by the output of said second band-pass filter, a tuning motor for adjusting the frequency of said oscillator, a power supply for said tuning motor, means connecting the contacts of said relays to control the connection of the power supplies to said tuning motor in response to said outputs from said first and second band-pass filters, a discriminator circuit connected to said second band-pass filter, a reactance device for the fine tuning of said oscillator connected to the output of said discriminator and means for connecting said reactance device to said oscillator.

7. A circuit arrangement for controlling the frequency of an oscillator, comprising means for deriving a frequency related to the fundamental frequency of the oscillator, a first band-pass filter covering a frequency band which is outside the related frequency derived from said oscillator, a second band-pass filter covering a frequency band adjacent the frequency band of said first filter and including said related frequency derived from said oscillator means for applying said related frequency to said first and second band-pass filters, a first relay operated by an output from said first band-pass filter, a second relay operated by an output from said second band-pass filter a tuning motor a power supply for said tuning motor, means for connecting the contacts of said relays to control the connection of the power supplies to said tuning motor in response to said outputs from said first and second band-pass filters a phase discriminator connected to said second band-pass filter, a frequency standard oscillator connected to said phase discriminator, a reactance device for the fine tuning of said oscillator connected to the output of said phase discriminator and means for connecting said reactance device to said oscillator upon an output being produced from said second band-pass filter.

References Cited in the file of this patent

UNITED STATES PATENTS

| | | |
|---|---|---|
| 2,104,801 | Hansell | Jan. 11, 1938 |
| 2,114,036 | Smith et al. | Apr. 12, 1938 |
| 2,231,174 | Trogner | Feb. 11, 1941 |